(12) United States Patent
Yanagisawa

(10) Patent No.: US 8,369,675 B2
(45) Date of Patent: Feb. 5, 2013

(54) OPTICAL WAVEGUIDE, OPTICAL WAVEGUIDE MOUNTING SUBSTRATE, AND LIGHT TRANSMITTING AND RECEIVING DEVICE

(75) Inventor: Kenji Yanagisawa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 247 days.

(21) Appl. No.: 12/632,259

(22) Filed: Dec. 7, 2009

(65) Prior Publication Data
US 2010/0142904 A1 Jun. 10, 2010

(30) Foreign Application Priority Data
Dec. 9, 2008 (JP) ................ P2008-313466

(51) Int. Cl.
*G02B 6/10* (2006.01)
(52) U.S. Cl. ......... 385/130; 385/129; 385/131; 385/132
(58) Field of Classification Search .......... 385/129–132
See application file for complete search history.

(56) References Cited

U.S. PATENT DOCUMENTS

| | | | | |
|---|---|---|---|---|
| 5,902,715 A * | 5/1999 | Tsukamoto et al. | .......... | 430/290 |
| 6,091,874 A * | 7/2000 | Higashi et al. | ........... | 385/130 |
| 6,438,307 B1 * | 8/2002 | Kaneko et al. | ........... | 385/131 |
| 6,554,491 B2 * | 4/2003 | Sotokawa et al. | .......... | 385/88 |
| 6,694,069 B2 * | 2/2004 | Kaneko et al. | ........... | 385/14 |
| 7,366,375 B2 * | 4/2008 | Ohtorii | .......... | 385/33 |
| 2005/0207693 A1 * | 9/2005 | Yokouchi | .......... | 385/14 |
| 2006/0245681 A1 * | 11/2006 | Uchida | .......... | 385/14 |
| 2006/0275004 A1 * | 12/2006 | Fujii et al. | .......... | 385/129 |
| 2007/0019899 A1 * | 1/2007 | Ohtsu et al. | .......... | 385/14 |
| 2007/0025671 A1 * | 2/2007 | Shimizu et al. | .......... | 385/129 |
| 2008/0285911 A1 * | 11/2008 | Yamamoto et al. | .......... | 385/14 |
| 2009/0028491 A1 * | 1/2009 | Fillion et al. | .......... | 385/14 |
| 2009/0092353 A1 * | 4/2009 | Chan et al. | .......... | 385/14 |

FOREIGN PATENT DOCUMENTS

| | | |
|---|---|---|
| JP | 2000-304953 | 11/2000 |
| JP | 2002-6161 | 1/2002 |
| JP | 2002-365457 | 12/2002 |
| WO | WO 2004/092235 A1 | 10/2004 |

* cited by examiner

*Primary Examiner* — Brian Healy
*Assistant Examiner* — Guy Anderson
(74) *Attorney, Agent, or Firm* — Drinker Biddle & Reath LLP

(57) ABSTRACT

An optical waveguide is provided. The optical waveguide includes: a layered structure including: a first cladding layer; a second cladding layer; and a core layer that is sandwiched between the first cladding layer and the second cladding layer, wherein an inclined surface is formed on at least one longitudinal end of the layered structure; and an outer cladding layer that seals at least a portion of the inclined surface corresponding to the core layer, wherein a refractive index of the outer cladding layer is smaller than that of the core layer.

15 Claims, 17 Drawing Sheets

OPTICAL WAVEGUIDE, OPTICAL WAVEGUIDE MOUNTING SUBSTRATE, AND LIGHT TRANSMITTING AND RECEIVING DEVICE

This application claims priority from Japanese Patent Application No. 2008-313466, filed on Dec. 9, 2008, the entire contents of which are hereby incorporated by reference.

BACKGROUND OF THE INVENTION

1. Technical Field

The present disclosure relates to an optical waveguide, which can transmit light, an optical waveguide mounting substrate, and a light transmitting and receiving device.

2. Related Art

In recent years, with the high density interconnection of the internal structure of integrated circuits, Central Processing Units (CPU) and the like have higher operating speeds (operating clock). However, the signal transmitting speed in an electrical transmission system has almost reached a limit, and the processing speed of the CPU and the like is bottlenecked. In addition, the high operating speed (operating clock) of the CPU and the like is accompanied by problems such as crosstalk noise or EMI (Electromagnetic Interference noise), which occur due to the high density interconnection. Accordingly, there remains a strong need for measures that can prevent such noise.

As an approach to solve these problems, an optical interconnection system using an optical waveguide is gaining attention. The optical interconnection system can carry out much wider broadband transmission than the electrical transmission system, cope with the high processing speed, and build up a signal transmission system using small, low power consumption optical components. Also, the optical interconnection system can suppress the crosstalk noise or the EMI noise. The optical waveguide generally has a reflecting mirror on one end thereof. The reflecting mirror is an inclined surface formed at an angle of about 45°, which serves to change the transmission direction of light (see e.g., JP-A-2002-006161 and JP-A-2002-365457).

However, in the related-art optical waveguide, a metal film, for example, of Au needs to be formed on the inclined surface by deposition or spattering in order to change the transmission direction of light. This disadvantageously increases the fabrication cost of the optical waveguide.

SUMMARY OF THE INVENTION

It is an aspect of the present invention to provide an optical waveguide, an optical waveguide mounting substrate, and a light transmitting and receiving device, which can promote a reduction in fabrication costs by eliminating the necessity of forming the metal film on the inclined surface.

According to one or more aspects of the present invention, there is provided an optical waveguide. The optical waveguide comprises: a layered structure comprising: a first cladding layer; a second cladding layer; and a core layer that is sandwiched between the first cladding layer and the second cladding layer, wherein an inclined surface is formed on at least one longitudinal end of the layered structure; and an outer cladding layer that seals at least a portion of the inclined surface corresponding to the core layer, wherein a refractive index of the outer cladding layer is smaller than that of the core layer.

Other aspects of the invention will be apparent from the following description, the drawings and the claims.

DETAILED DESCRIPTION OF EXEMPLARY EMBODIMENTS

Exemplary embodiments of the present invention will be now described with reference to the drawings.

First Embodiment

Structure of Optical Waveguide

Figure 1:
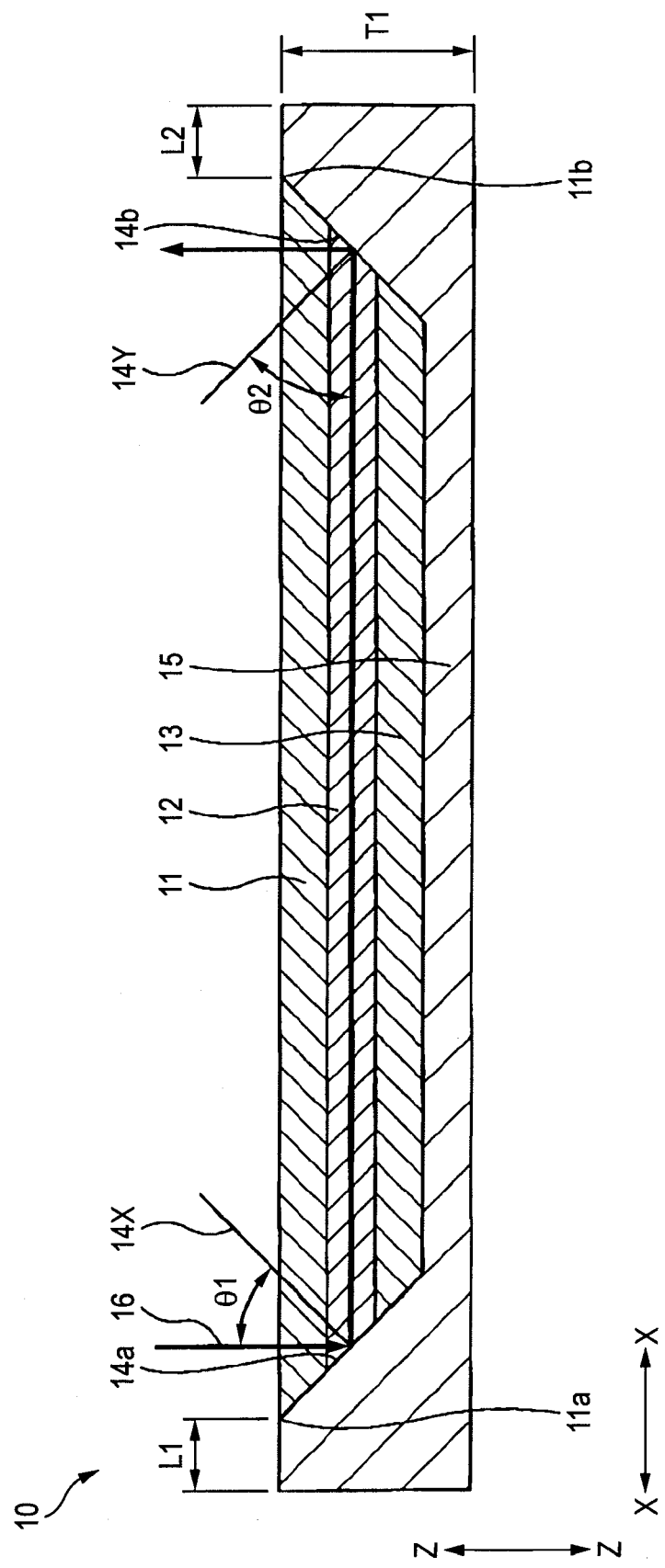
FIG. 1 is a cross-sectional view illustrating an optical waveguide in accordance with a first exemplary embodiment of the invention.

First, the structure of an optical waveguide 10 in accordance with a first exemplary embodiment of the invention will be now described. FIG. 1 is a cross-sectional view illustrating the optical waveguide 10 in accordance with the first exemplary embodiment of the invention. Referring to FIG. 1, the optical waveguide 10 includes a first cladding layer 11, a core layer 12, a second cladding layer 13, inclined surfaces 14a and 14b, and an outer cladding layer 15. In FIG. 1, reference numerals 11a and 11b indicate the leading ends of the first cladding layer 11. In addition, reference numeral 14X indicates a normal line perpendicular to the inclined surface 14a, reference numeral 14Y indicates a normal line perpendicular to the inclined surface 14b. In addition, reference numeral 16 indicates a ray of incident light on the optical waveguide 10.

In the optical waveguide 10, the first cladding layer 11, the core layer 12, and the second cladding layer 13 cooperate with each other to form a layered structure. The first cladding layer 11 and the second cladding layer 13 are made of, for example, a liquid polymeric material such as a polyimide resin, an acrylic resin, an epoxy resin, a polyolefin resin, a polynorbornene resin, or a fluoride thereof; or a polymeric material such as an epoxy-based film material. The refractive index Na of the first cladding layer 11 and the second cladding layer 13 can be, for example, about 1.5. The respective thickness of the first cladding layer 11 and the second cladding layer 13 can be, for example, in the range from about 10 μm to about 60 μm.

The core layer 12 is sandwiched between the first cladding layer 11 and the second cladding layer 13. The core layer 12 is made of, for example, a liquid polymeric material such as a polyimide resin, an acrylic resin, an epoxy resin, a polyolefin resin, a polynorbornene resin, or a fluoride thereof; or a polymeric material such as an epoxy-based film material. The polymeric material of the core layer 12 contains a refractive index controlling agent such as Ge since the refractive index of the core layer 12 is required to be set higher than that of the first cladding layer 11 and the second cladding layer 13. The refractive index Nb of the core layer 12 can be, for example, about 1.6. The thickness of the core layer 12 can be, for example, in the range from about 30 μm to about 80 μm.

The inclined surfaces 14a and 14b are formed on opposite ends of the layered structure including the first cladding layer 11, the core layer 12, and the second cladding layer 13. The inclined surface 14a is configured so that a given angle of incidence θ1 is formed between the incident light 16 and the normal line 14X. The inclined surface 14b is configured so that a given angle of incidence θ2 is formed between the incident light 16 and the normal line 14Y. It is possible to freely set the angles of incidence θ1 and θ2 to any value, for example, to about 45°.

As will be described later, the inclined surfaces 14a and 14b have a function of totally or partially reflecting the incident light 16. In addition, a metal film is not formed on the inclined surfaces 14a and 14b.

The outer cladding layer 15 is formed to partially seal the first cladding layer 11, the core layer 12, and the second cladding layer 13. The outer cladding layer 15 is made of a material whose refractive index is lower than that of the core layer 12. Preferably, the heat resistance of the outer cladding layer 15 can be substantially the same as that of the first cladding layer 11, the core layer 12, and the second cladding layer 13. The outer cladding layer 15 can be implemented with, for example, tetrafluoroethylene-perfluoro-dioxol copolymer, which is an annular fluorine resin. The annular fluorine resin is a perfluoro resin that has an annular ether structure in a chain. The refractive index Nc of the outer cladding layer 15 can be, for example, about 1.3. The thickness T1 of the outer cladding layer 15 can be, for example, in the range from about 50 μm to about 250 μm.

The outer cladding layer 15 must seal the portions of the inclined surfaces 14a and 14b corresponding to the core layer 12. Thus, the inclined surfaces 14a and 14b are provided with the function of totally or partially reflecting the incident light 16, as described later, by sealing the inclined surfaces 14a and 14b with the outer cladding layer 15, the material of which has a lower refractive index than that of the core layer 12.

It is advantageous that the outer cladding layer 15 can seal the entire portions of the inclined surfaces 14a and 14b in such a manner that distances L1 and L2 are set to given values, respectively. Namely, even though the leading ends 11a and 11b of the first cladding layer 11, which are formed at an acute angle, may be damaged while being carried or mounted, the setting of the distances L1 and L2 to the given values makes it possible to prevent the leading ends 11a and 11b of the first cladding layer 11 from being damaged. The distances L1 and L2 can be set, for example, to about 5 μm.

In addition, the refractive index Na of the first cladding layer 11 and the second cladding layer 13, the refractive index Nb of the core layer 12, and the refractive index Nc of the outer cladding layer 15 are set to satisfy the relationship in Formula (I).

Refractive index Na>Refractive index Nb>Refractive index Nc (1)

[Fabrication Method of Optical Waveguide]

A description will be given of a fabrication method of the optical waveguide 10 in accordance with the first exemplary embodiment. FIGS. 2 through 9 are views illustrating fabrication processes of the optical waveguide 10 in accordance with the first exemplary embodiment. In FIGS. 2 through 9, the same reference numerals will be given to the same components as in FIG. 1, and the description of the same components will be omitted when necessary.

Figure 2:
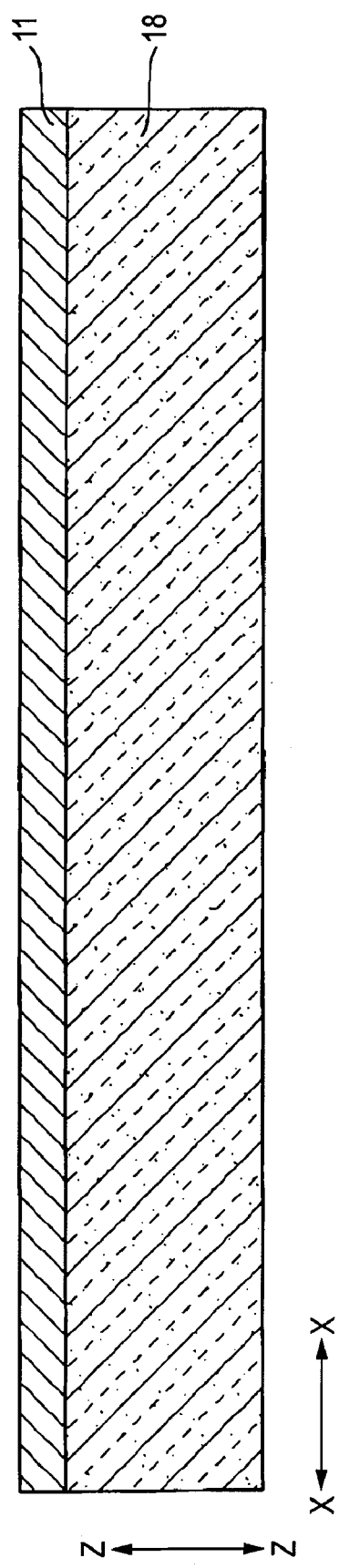
FIG. 2 is a schematic view illustrating a (first) fabrication process of the optical waveguide in accordance with the first exemplary embodiment of the invention.

First, in the process shown in FIG. 2, a support substrate 18 is prepared, and the first cladding layer 11 is formed on the support substrate 18. The support substrate 18 can be implemented with, for example, a glass substrate, a silicon substrate, or the like. The first cladding layer 11 can be formed, for example, by applying a liquid polymeric material such as a polyimide resin, an acrylic resin, an epoxy resin, a polyolefin resin, a polynorbornene resin, or a fluoride thereof on the support substrate 18, and then by curing the polymeric material by ultraviolet (UV) irradiation and heating. Alternatively, the first cladding layer 11 can be formed, for example, by laminating a polymeric material such as an epoxy-based film on the support substrate 18, and then by curing the film by UV irradiation and heating. The thickness of the first cladding layer 11 may be set to, for example, from about 10 μm to about 60 μm.

Figure 3:
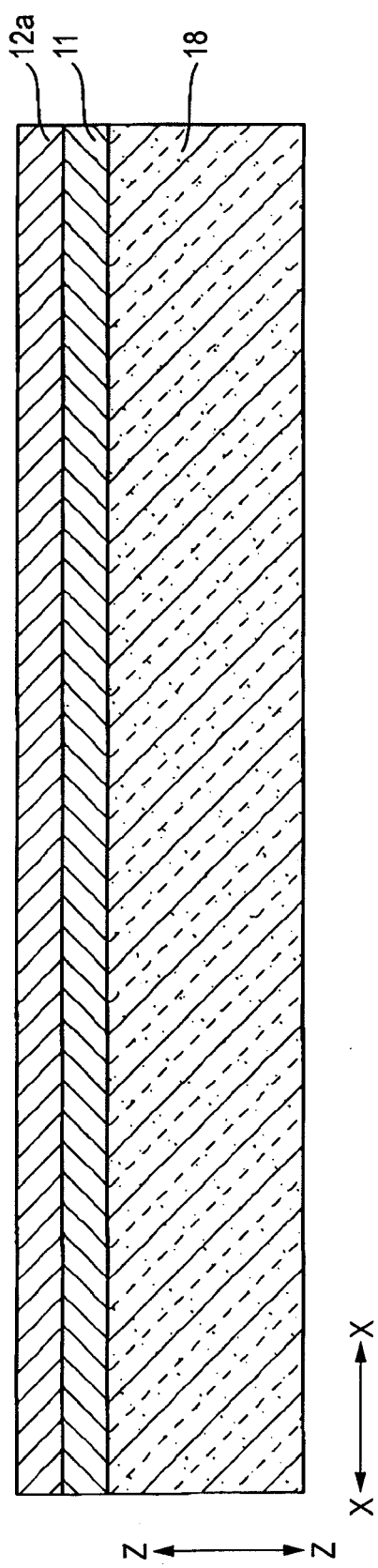
FIG. 3 is a schematic view illustrating a (second) fabrication process of the optical waveguide in accordance with the first exemplary embodiment of the invention.

Then, in the process shown in FIG. 3, a core layer 12a is formed on the first cladding layer 11. The core layer 12a is a layer that will form the core layer 12 by patterning. The core layer 12a can be formed, for example, by applying a liquid polymeric material such as a polyimide resin, an acrylic resin, an epoxy resin, a polyolefin resin, a polynorbornene resin, or a fluoride thereof on the first cladding layer 11. Alternatively, the core layer 12a can be formed, for example, by laminating a polymeric material such as an epoxy-based film on the first cladding layer 11.

In this case, the polymeric material of the core layer 12a contains a refractive index-controlling agent such as Ge since the refractive index of the core layer 12a is required to be set higher than that of the first cladding layer 11 and the second cladding layer 13 (described later). The thickness of the core layer 12a can be, for example, in the range from about 30 μm to about 80 μm.

Figure 4:
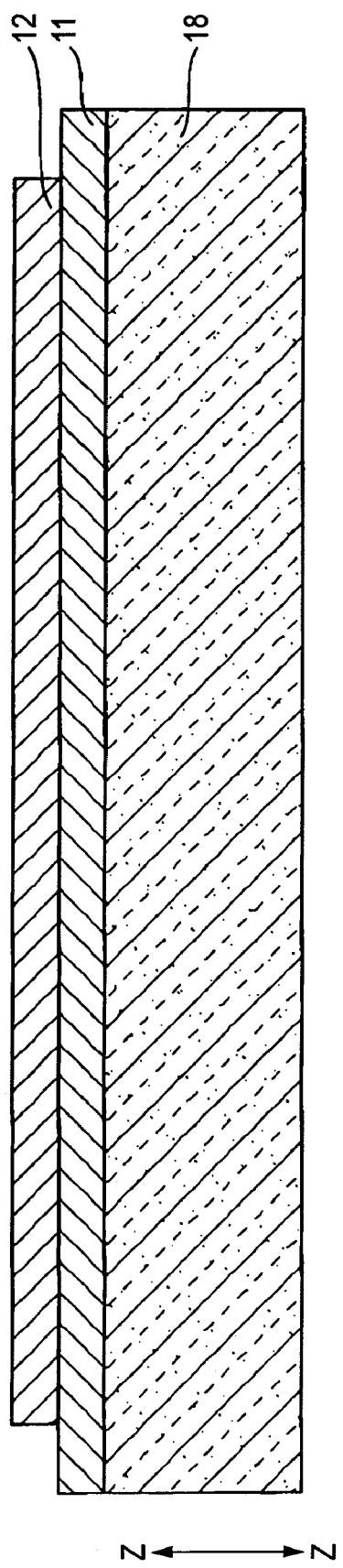
FIG. 4 is a schematic view illustrating a (third) fabrication process of the optical waveguide in accordance with the first exemplary embodiment of the invention.

Next, in the process shown in FIG. 4, the core layer 12 is formed by patterning the core layer 12a. For example, when the core layer 12a is implemented with a negative photosensitive material, the core layer 12 can be formed by covering a photo-mask (not shown) on the core layer 12a so as to expose only given portions of the core layer 12a, which are to be used as the core layer 12, followed by exposure, development, and curing by UV irradiation and heating.

Figure 5:
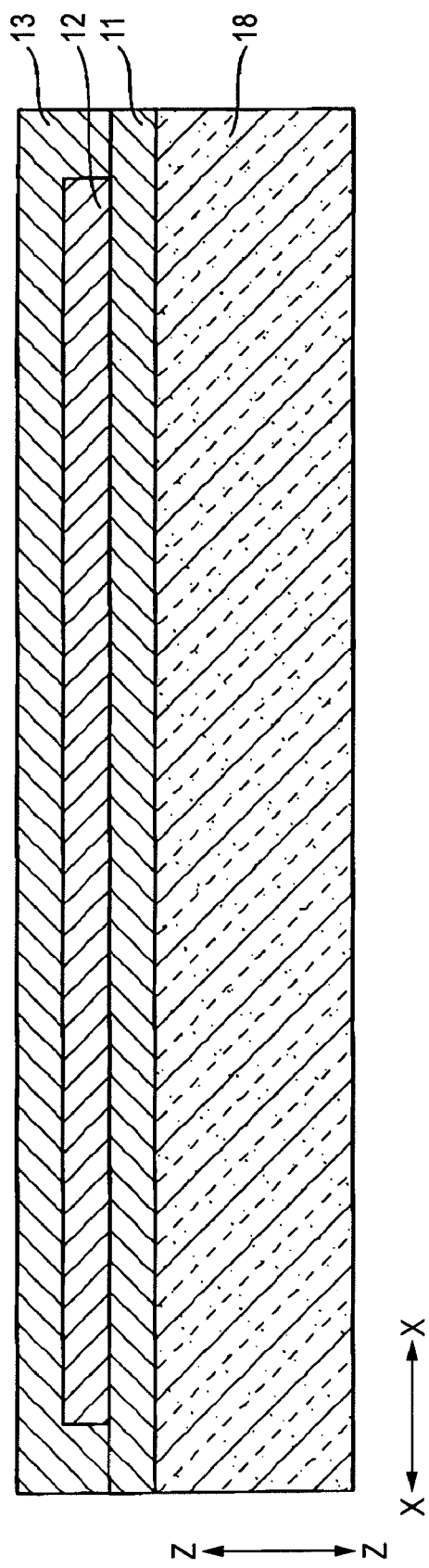
FIG. 5 is a schematic view illustrating a (fourth) fabrication process of the optical waveguide in accordance with the first exemplary embodiment of the invention.

Afterwards, in the process shown in FIG. 5, the second cladding layer 13 is formed over the first cladding layer 11 to cover the core layer 12. Through this process, the core layer 12 is covered by the first cladding layer 11 and the second cladding layer 13. The second cladding layer 13 can be formed by applying or laminating a polymeric material, which is the same as the polymeric material used for the first cladding layer 11 in the process shown in FIG. 4, on the first cladding layer 11, followed by curing by UV irradiation and heating. The thickness of the layered structure including the first cladding layer 11, the core layer 12, and the second cladding layer 13 can be, for example, in the range from about 50 μm to about 200 μM.

Figure 6:
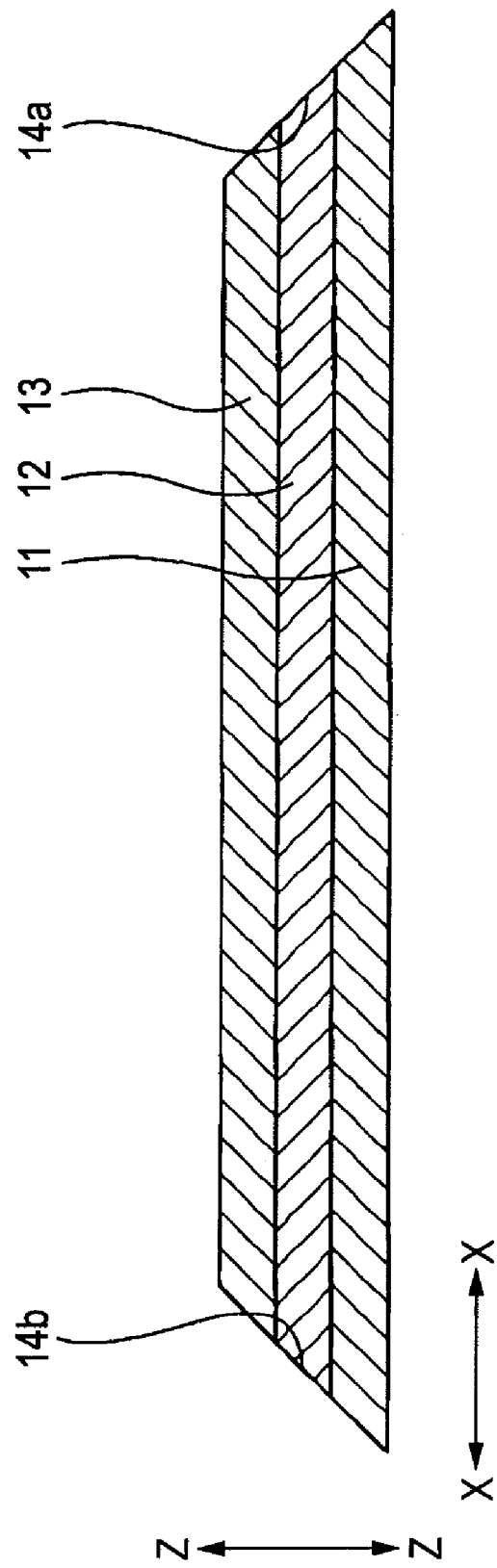
FIG. 6 is a schematic view illustrating a (fifth) fabrication process of the optical waveguide in accordance with the first exemplary embodiment of the invention.

Next, in the process shown in FIG. 6, the layered structure including the first cladding layer 11, the core layer 12, and the second cladding layer 13 is separated from the support substrate 18, and then the inclined surfaces 14a and 14b are formed on opposite ends of the layered structure including the first cladding layer 11, the core layer 12, and the second cladding layer 13. The inclined surfaces 14a and 14b can be formed, for example, by dicing. The inclined surfaces 14a and 14b have a function of totally or partially reflecting a ray of incident light entering from the first cladding layer 11.

The inclined surface 14a is formed such that a given angle of incidence is formed between a normal line thereof and the incident light. The inclined surface 14b is formed such that a given angle of incidence is formed between a normal line thereof and the incidence light. It is possible to set the angle of incidence to any value, for example, to about 45°. In addition, the inclined surfaces 14a and 14b can be subjected to planarization treatment such as polishing.

The related-art fabrication method of an optical waveguide has a process of forming a metal film of Au or the like on the inclined surfaces 14a and 14b after the process shown in FIG. 6. However, the fabrication method of the optical waveguide 10 in accordance with the first exemplary embodiment does not require this process.

Figure 7:
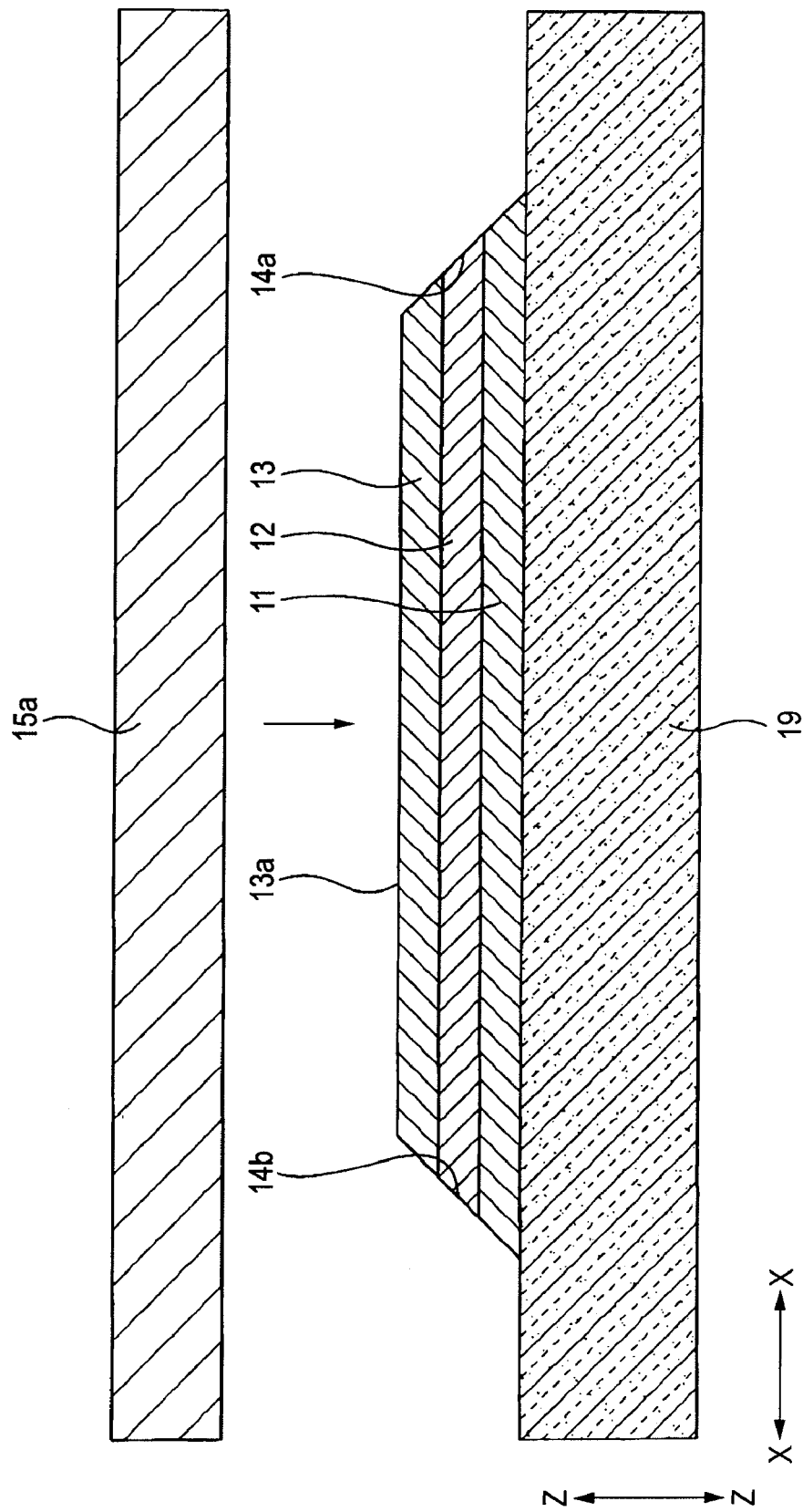
FIG. 7 is a schematic view illustrating a (sixth) fabrication process of the optical waveguide in accordance with the first exemplary embodiment of the invention.

Subsequently, in the process shown in FIG. 7, a support substrate 19 is prepared, and the layered structure including the first cladding layer 11, the core layer 12, and the second cladding layer 13 is arranged on the support substrate 19 such that, for example, the cladding layer 11 is located adjacent to the support substrate 19. The support substrate 19 can be implemented with, for example, a glass substrate, a silicon substrate, or the like. In addition, an outer cladding layer 15a is prepared, and is then arranged above the support substrate 19 so as to cover the layered structure including the first cladding layer 11, the core layer 12, and the second cladding layer 13.

The outer cladding layer 15a is a layer that will finally form an outer cladding layer 15. The outer cladding layer 15a is made of a material, whose refractive index is lower than that of the core layer 12. It is advantageous that the heat resistance of the outer cladding layer 15a can be substantially the same as that of the first cladding layer 11, the core layer 12, and the second cladding layer 13. The outer cladding layer 15a can be implemented with, for example, a film of tetrafluoroethylene-perfluoro-dioxol copolymer, which is an annular fluorine resin. The annular fluorine resin is a perfluoro resin that has an annular ether structure in a chain. The refractive index Nc of the outer cladding layer 15a can be set, for example, to about 1.3.

Before the outer cladding layer 15a is arranged, a surface 13a of the second cladding layer 13, which will come into contact with the outer cladding layer 15a, can be subjected to roughening treatment. An example of the roughening treatment can be ashing such as $O_2$ plasma ashing or ozone ashing. The surface 13a is roughened by the ashing, thereby forming microscopic irregularities thereon. Another example of the roughening treatment can be a method of transferring microscopic irregularities on one surface of a Cu sheet to the surface 13a by placing the Cu sheet having microscopic irregularities on the surface 13a, pressing the Cu sheet against the surface 13a, and removing the Cu sheet from the surface 13a. The roughening of the surface 13a can enhance the bonding between the surface 13a and the outer cladding layer 15a.

Figure 8:
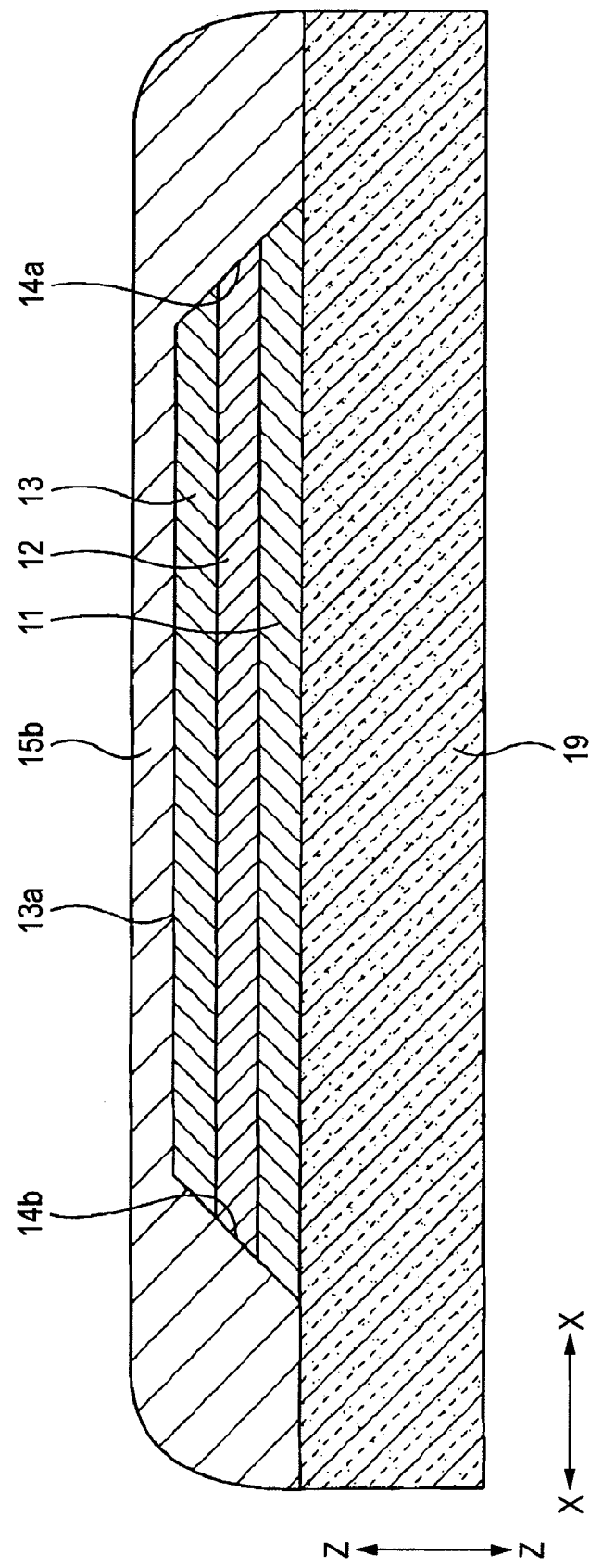
FIG. 8 is a schematic view illustrating a (seventh) fabrication process of the optical waveguide in accordance with the first exemplary embodiment of the invention.

Afterwards, in the process shown in FIG. 8, an outer cladding layer 15b is formed by pressing the outer cladding layer 15a, which is arranged above the support substrate 19, to cover the layered structure including the first cladding layer 11, the core layer 12, and the second cladding layer 13, and heating, for example, at about 120° C. The outer cladding layer 15b is cured by the heating. The outer cladding layer 15b is the layer that will finally form the outer cladding layer 15. The outer cladding layer 15b is formed to partially seal the layered structure including the first cladding layer 11, the core layer 12, and the second cladding layer 13.

Here, the outer cladding layer 15 must seal portions of the inclined surfaces 14a and 14b corresponding to the core layer 12. The inclined surfaces 14a and 14b are provided with the function of totally or partially reflecting the incident light 16, as described later, by sealing the inclined surfaces 14a and 14b with the outer cladding layer 15, the material of which has a lower refractive index than that of the core layer 12.

Figure 9:
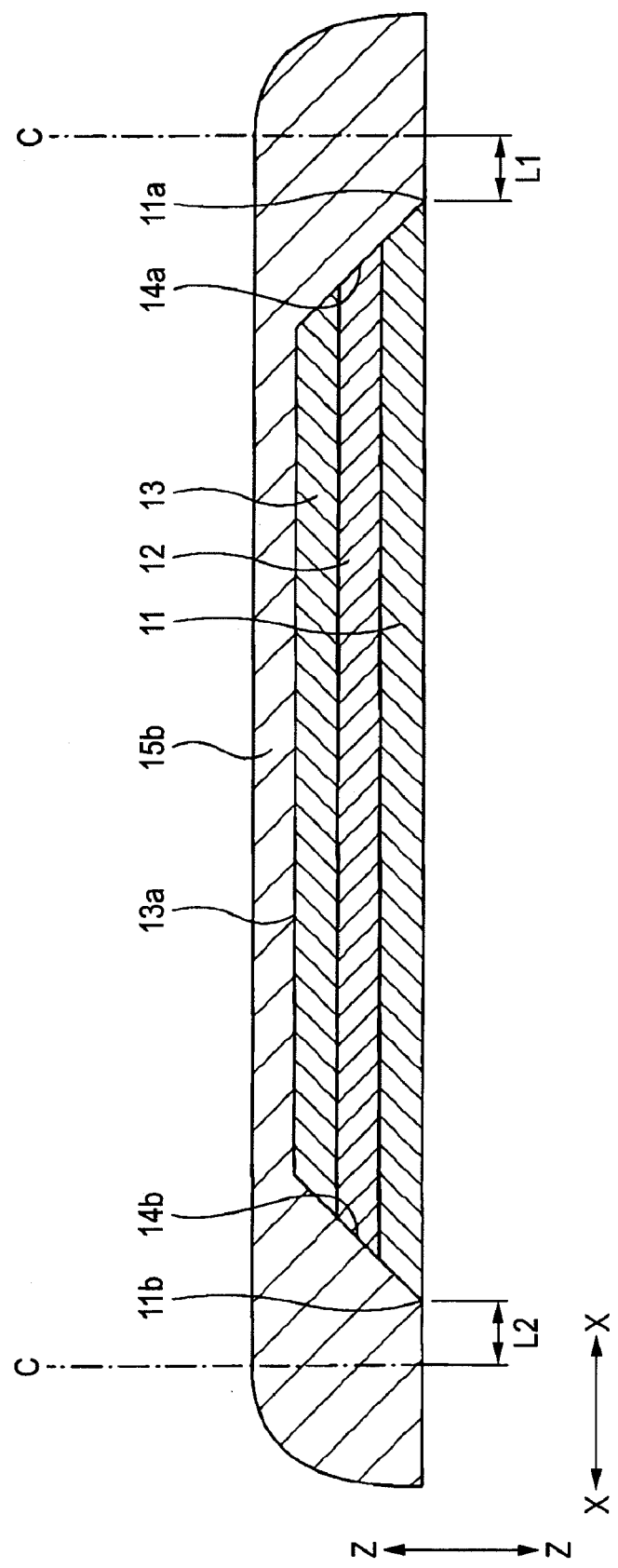
FIG. 9 is a schematic view illustrating an (eighth) fabrication process of the optical waveguide in accordance with the first exemplary embodiment of the invention.

Next, in the process shown in FIG. 9, the layered structure shown in FIG. 8 is separated from the support substrate 19, and is cut at cutting positions C by dicing or the like. After cutting the layered structure, the outer cladding layer 15b becomes the outer cladding layer 15. This, as a result, produces the optical waveguide 10 as shown in FIG. 1. It is advantageous that the distance L1 from the leading end 11a of the first cladding layer 11 to the cutting position C in the X axis direction (i.e., the longitudinal direction of the first cladding layer 11) and the distance L2 from the leading end 11b of the first cladding layer 11 to the cutting position C in the X axis direction (i.e., the longitudinal direction of the first cladding layer 11) are not set to zero. This is because, even though the leading ends 11a and 11b of the first cladding layer 11, which are formed at an acute angle, may be damaged while being carried or mounted, the setting of the distances L1 and L2 to the given values makes it possible to prevent the leading ends 11a and 11b of the first cladding layer 11 from being damaged while being carried or mounted. The distances L1 and L2 can be set, for example, to about 5 μm.

[Function of Optical Waveguide]

Afterwards, a description will be given of the function of the optical waveguide 10 in accordance with the first exemplary embodiment of the invention. Referring to FIG. 1, the incident light 16 enters the optical waveguide 10 from the direction of the first cladding layer 11. The incident light 16, which enters the optical waveguide 10, is reflected by the inclined surface 14a, which is the boundary between the core layer 12 and the outer cladding layer 15. As described above, even though a metal film is not formed on the inclined surface 14a, the incident light 16 is reflected by the inclined surface 14a on the following reasons.

If the angle of incidence θ1 of the incident light 16 onto the inclined surface 14a (i.e., the angle of the incident light 16 with respect to the normal line of the inclined surface 14a acting as the incidence surface) is greater than a critical angle, the incident light 16 is totally reflected by the inclined surface 14a to enter the core layer 12 without entering the outer cladding layer 15. If the angle of incidence θ1 of the incident light 16 onto the inclined surface 14a is smaller than the critical angle, one portion of the incident light 16 is reflected by the inclined surface 14a to enter the core layer 12, and the other portion of the incident light 16 enters the outer cladding layer 15.

Total reflection is an optical phenomenon in that, when light from a medium A having a greater refractive index is entering a medium B having a smaller refractive index, the light is totally reflected without passing through the boundary. In addition, it is well-known as Snell's law, and the size of a critical angle (i.e., a maximum angle of incidence where refraction occurs) is determined by refractive index. When the light strikes the boundary to enter the medium B (having a refractive index N2) from the medium A (having a refractive index N1), total reflection conditions are θb>θm in the formula: $\theta m=\sin^{-1}(N2/N1)$ and, where N1>N2, θm is a critical angle, and θb is an angle of incidence from the medium A to the medium B.

In the case shown in FIG. 1, the core layer 12 corresponds to the medium A, and the outer cladding layer 15 corresponds to the medium B. For example, if the refractive index Na of the core layer 12 is 1.6 and the refractive index Nc of the outer cladding layer 15 is 1.3, the critical angle θm in the inclined surface 14a is represented by $\theta m=\sin^{-1}(1.3/1.6)=54$ deg. In this case, if the angle of incidence θb is greater than 54 deg, the incident light 16 is totally reflected by the inclined surface 14a to enter the core layer 12.

The size relationship of the refractive index Na of the core layer 12 with respect to the refractive index Nb of the first cladding layer 11 and the second cladding layer 13 is the same as or similar to the size relationship of the refractive index Na of the core layer 12 with respect to the refractive index Nc of the outer cladding layer 15. Thus, the incident light 16, which has entered the core layer 12, travels through the inside of the core layer 12 along the longitudinal direction of the core layer 12 without entering the first cladding layer 11 or the second cladding layer 13 before reaching the inclined surface 14b. On the same reasons as described above, the incident light 16 is reflected by the inclined surface 14b, thereby going outside the optical waveguide 10. The functions of the optical waveguide 10 in accordance with the first exemplary embodiment of the invention are described as above.

According to the optical waveguide 10 in accordance with the first exemplary embodiment, even if a metal film is not formed on the inclined surfaces 14a and 14b, it is possible to totally or partially reflect the incident light 16, which has entered the optical waveguide 10, from the inclined surfaces 14a and 14b by sealing the inclined surfaces 14a and 14b with the outer cladding layer 15, the material of which has a lower refractive index than that of the core layer 12. As a result, this allows to promote a reduction in the fabrication cost of the optical waveguide 10.

In addition, it is possible to prevent the leading ends 11a and 11b of the first cladding layer 11 from being damaged while being carried and mounted by applying given values, which are not 0, to the distance L1 from the leading end 11a of the first cladding layer 11 to the cutting position C in the X axis direction (i.e., the lengthwise direction of the first cladding layer 11) and to the distance L2 from the leading end 11b of the first cladding layer 11 to the cutting position C in the X axis direction (i.e., the lengthwise direction of the first cladding layer 11), respectively.

Second Exemplary Embodiment

A second exemplary embodiment of the invention presents an example of an optical waveguide mounting substrate on which the optical waveguide in accordance with the first exemplary embodiment is mounted.

[Structure of Optical Waveguide Mounting Substrate]

Figure 10:
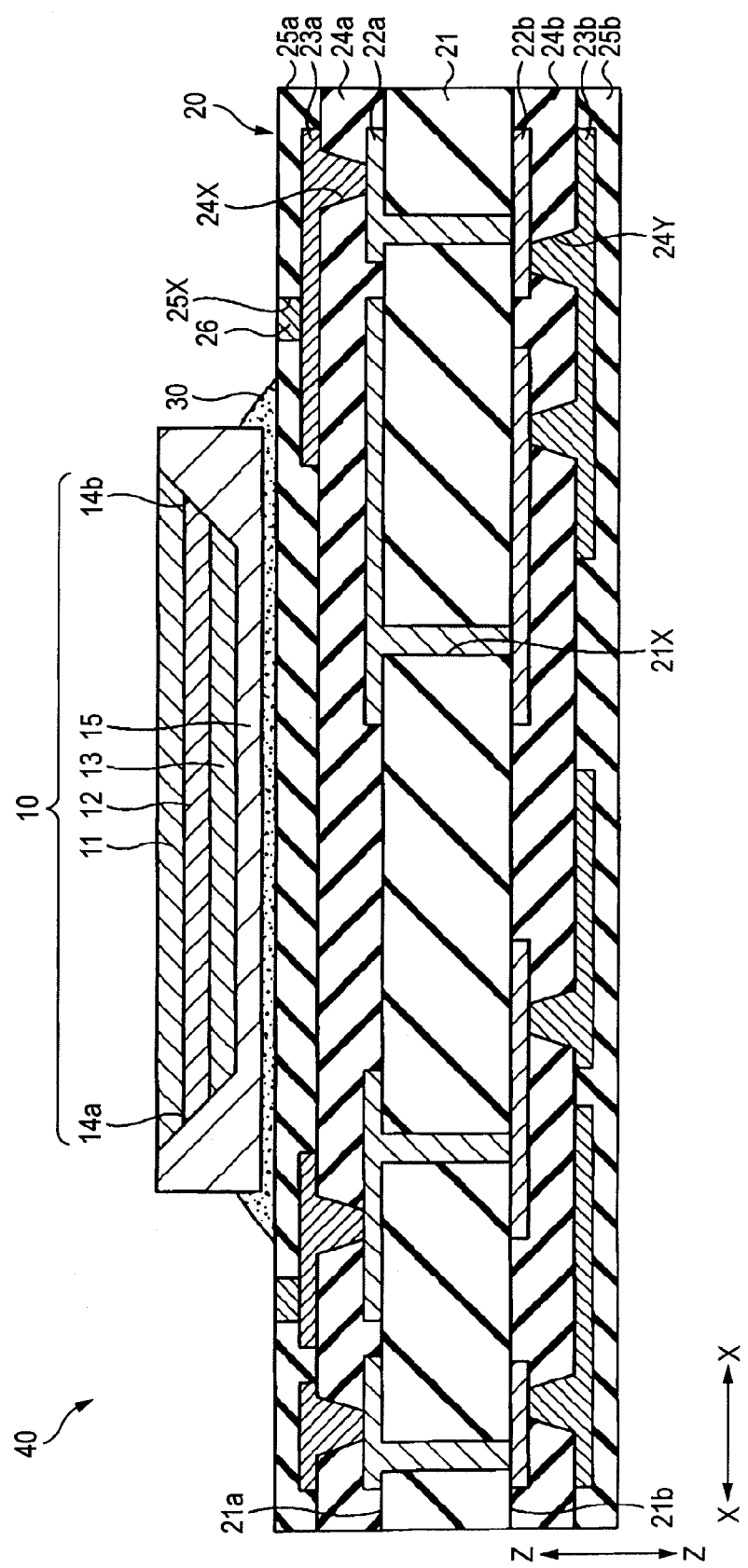
FIG. 10 is a cross-sectional view illustrating an optical waveguide mounting substrate in accordance with a second exemplary embodiment of the invention.

First, a description will be given of the structure of an optical waveguide mounting substrate 40 in accordance with a second exemplary embodiment of the invention. FIG. 10 is a cross-sectional view illustrating the optical waveguide mounting substrate 40 in accordance with the second exemplary embodiment. Referring to FIG. 10, the optical waveguide mounting substrate 40 in accordance with the second exemplary embodiment includes an optical waveguide 10, a wiring substrate 20, and a bonding portion 30. Since the optical waveguide 10 is configured the same as that in the first exemplary embodiment, description thereof will be omitted herein.

The wiring substrate 20 includes a core substrate 21, a first wiring layer 22a, a second wiring layer 23a, a third wiring layer 22b, a fourth wiring layer 23b, a first insulating layer 24a, a second insulating layer 24b, a first solder resist layer 25a, a second solder resist layer 25b, and a solder land 26.

The core substrate 21 is provided adjacent to the central part of the wiring substrate 20. The material of the core substrate 21 can be implemented, for example, by impregnating an epoxy resin into a glass cross. The thickness of the core substrate 21 can be set, for example, to about 50 μm.

The first wiring layer 22a is formed on surface 21a which is one surface of the core substrate 21. The material of the first wiring layer 22a can be implemented with, for example, Cu. The thickness of the first wiring layer 22a can be set, for example, to about 10 μm. The first insulating layer 24a is formed on surface 21a which is one surface of the core substrate 21 to cover the first wiring layer 22a. The material of the first insulating layer 24a can be implemented with, for example, an epoxy-based insulating resin or the like. The thickness of the first insulating layer 24a can be set, for example, to about 30 μm.

The second wiring layer 23a is formed over the first insulating layer 24a. The material of the second wiring layer 23a can be implemented with, for example, Cu. The thickness of the second wiring layer 23a can be set, for example, to about 10 μm. The first wiring layer 22a and the second wiring layer 23a are electrically connected to each other by a via hole 24X, which extends through the first insulating layer 24a.

The first solder resist layer 25a is formed over the first insulating layer 24a to cover the second wiring layer 23a. The material of the first solder resist layer 25a can be implemented with, for example, a photosensitive resin composition. The thickness of the first solder resist layer 25a can be set, for example, to about 10 μm. The first solder resist layer 25a has openings 25X that expose given portions of the second wiring layer 23a. The solder land 26 is formed over the portions of the second wiring layer 23a, which are exposed through the openings 25X. The solder land 26 is produced by applying, for example, a solder cream on the portions of the second wiring layer 23a, exposed through the openings 25X, and then curing the solder cream.

The third wiring layer 22b is formed over the other surface 21b of the core substrate 21. The material of the third wiring layer 22b can be implemented with, for example, Cu. The thickness of the third wiring layer 22b can be set, for example, to about 10 µm. The first wiring layer 22a and the third wiring layer 22b are electrically connected to each other by a via hole 21X, which extends through the core substrate 21. The second insulating layer 24b is formed on the other surface 21b of the core substrate 21 to cover the third wiring layer 22b. The material of the second insulating layer 24b can be implemented with, for example, an epoxy-based insulating resin. The thickness of the second insulating layer 24b can be set, for example, to about 30 µm.

The fourth wiring layer 23b is formed over the second insulating layer 24b. The material of the fourth wiring layer 23b can be implemented with, for example, Cu. The thickness of the fourth wiring layer 23b can be set, for example, to about 10 µm. The third wiring layer 22b and the fourth wiring layer 23b are electrically connected to each other by a via hole 24Y, which extends through the second insulating layer 24b. The second solder resist layer 25b is formed on the second insulating layer 24b to cover the fourth wiring layer 23b. The material of the second solder resist layer 25b can be implemented with, for example, a photosensitive resin composition. The thickness of the second solder resist layer 25b can be set, for example, to about 10 µm.

The optical waveguide 10 is fixed onto the wiring substrate 20 by the bonding portion 30 such that the outer cladding layer 15 faces the first solder resist layer 25a. The material of the bonding portion 30 can be implemented with, for example, a thermosetting epoxy-based adhesive or a UV curing epoxy-based adhesive. The structure of the optical waveguide mounting substrate 40 in accordance with the second exemplary embodiment of the invention is described as above.

[Fabrication Method of Optical Waveguide Mounting Substrate]

Figure 11:
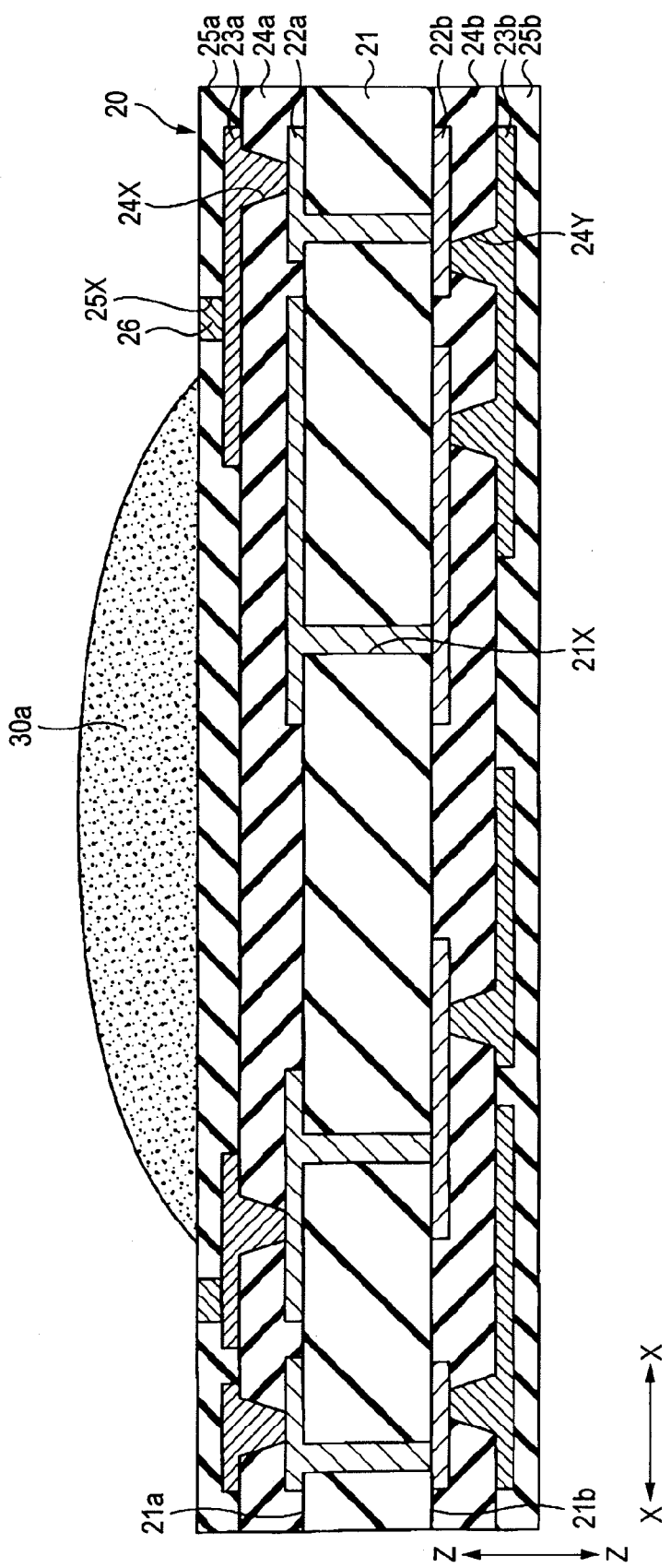
FIG. 11 is a schematic view illustrating a (first) fabrication process of the an optical waveguide mounting substrate in accordance with the second exemplary embodiment of the invention.
Figure 12:
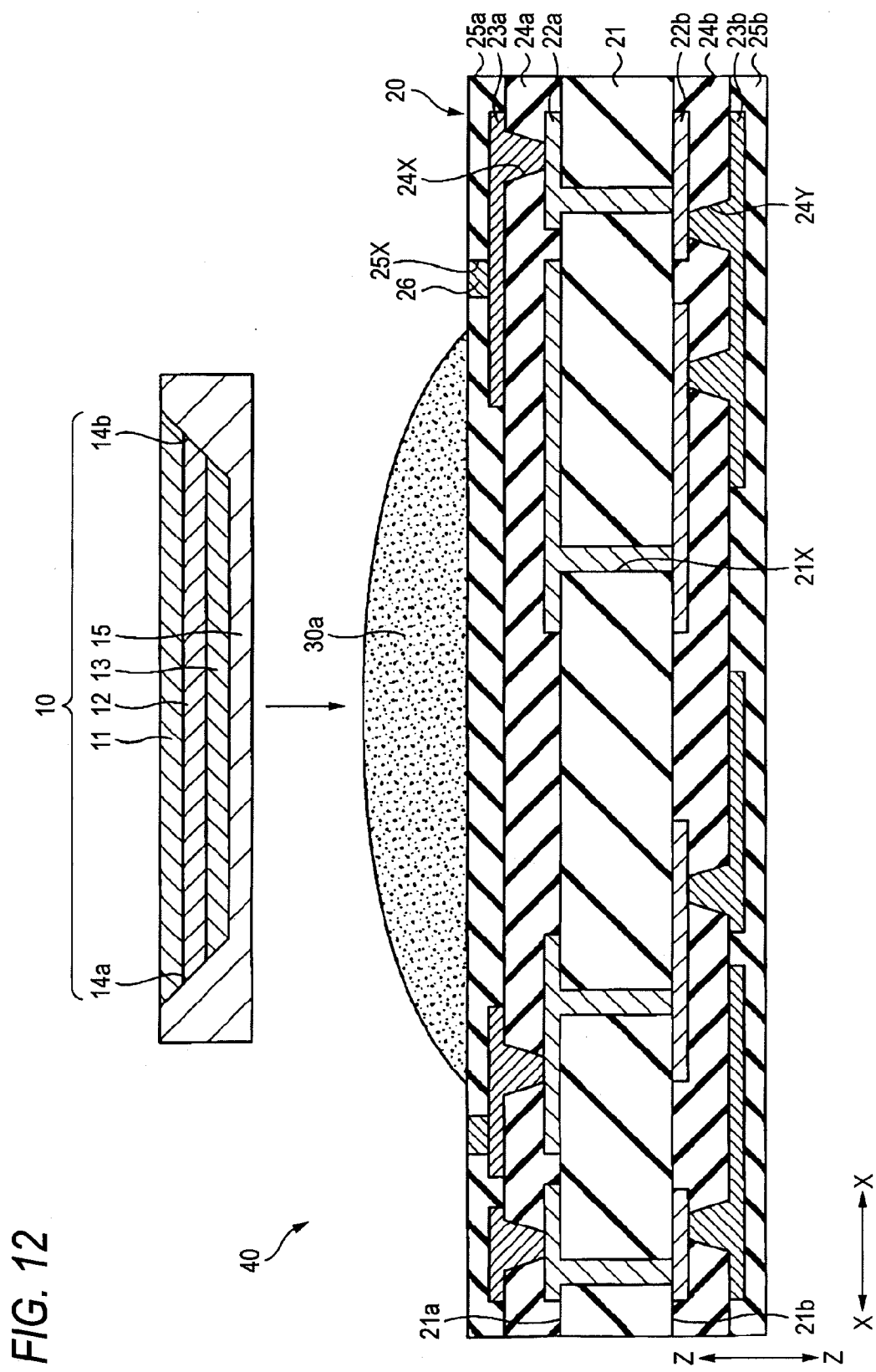
FIG. 12 is a schematic view illustrating a (second) fabrication process of the an optical waveguide mounting substrate in accordance with the second exemplary embodiment of the invention.

Next, a description will be given of a fabrication method of the optical waveguide mounting substrate 40 in accordance with the second exemplary embodiment. FIGS. 11 and 12 are views illustrating fabrication processes of the optical waveguide mounting substrate 40. In FIGS. 11 and 12, the same reference numerals will be given to the same components as in FIG. 10, and the description of the same components will be omitted when necessary.

First, in the process shown in FIG. 11, the wiring substrate 20 is prepared, and an adhesive 30a is applied on the first solder resist layer 25a of the wiring substrate 20. The wiring substrate 20 is configured the same as described above. The adhesive 30a will finally form the bonding portion 30. The material of the adhesive 30a can be implemented with, for example, a thermosetting epoxy-based adhesive or a UV curing epoxy-based adhesive.

Afterwards, in the process shown in FIG. 12, the optical waveguide 10 is arranged on the adhesive 30a. Specifically, the optical waveguide 10 is adsorbed by a stage arm of a precision stage. Then, the optical waveguide 10 is aligned and arranged on the adhesive 30a by adjusting the position of the optical waveguide 10 with respect to, for example, the solder land 26 of the wiring substrate 20 by moving the stage arm.

Next, the adhesive 30a is cured by heating the adhesive 30a or irradiating UV rays onto the adhesive 30a. The cured adhesive 30a becomes the bonding portion 30. Thus, the optical waveguide mounting substrate 40 is produced as shown in FIG. 10. The fabrication method of the optical waveguide mounting substrate 40 in accordance with the second exemplary embodiment of the invention is described as above.

[Function of Optical Waveguide Mounting Substrate]

The function of the optical waveguide mounting substrate 40 in accordance with the second exemplary embodiment is the same as that of the optical waveguide 10 in accordance with the first exemplary embodiment, and thus the description thereof will be omitted herein.

The optical waveguide mounting substrate 40 in accordance with the second exemplary embodiment of the invention can realize an optical waveguide mounting substrate on which the optical waveguide 10 in accordance with the first exemplary embodiment is mounted. Accordingly, the same effects as those of the optical waveguide 10 in accordance with the first exemplary embodiment are obtained.

[Structure of Optical Waveguide Mounting Substrate]

Figure 13:
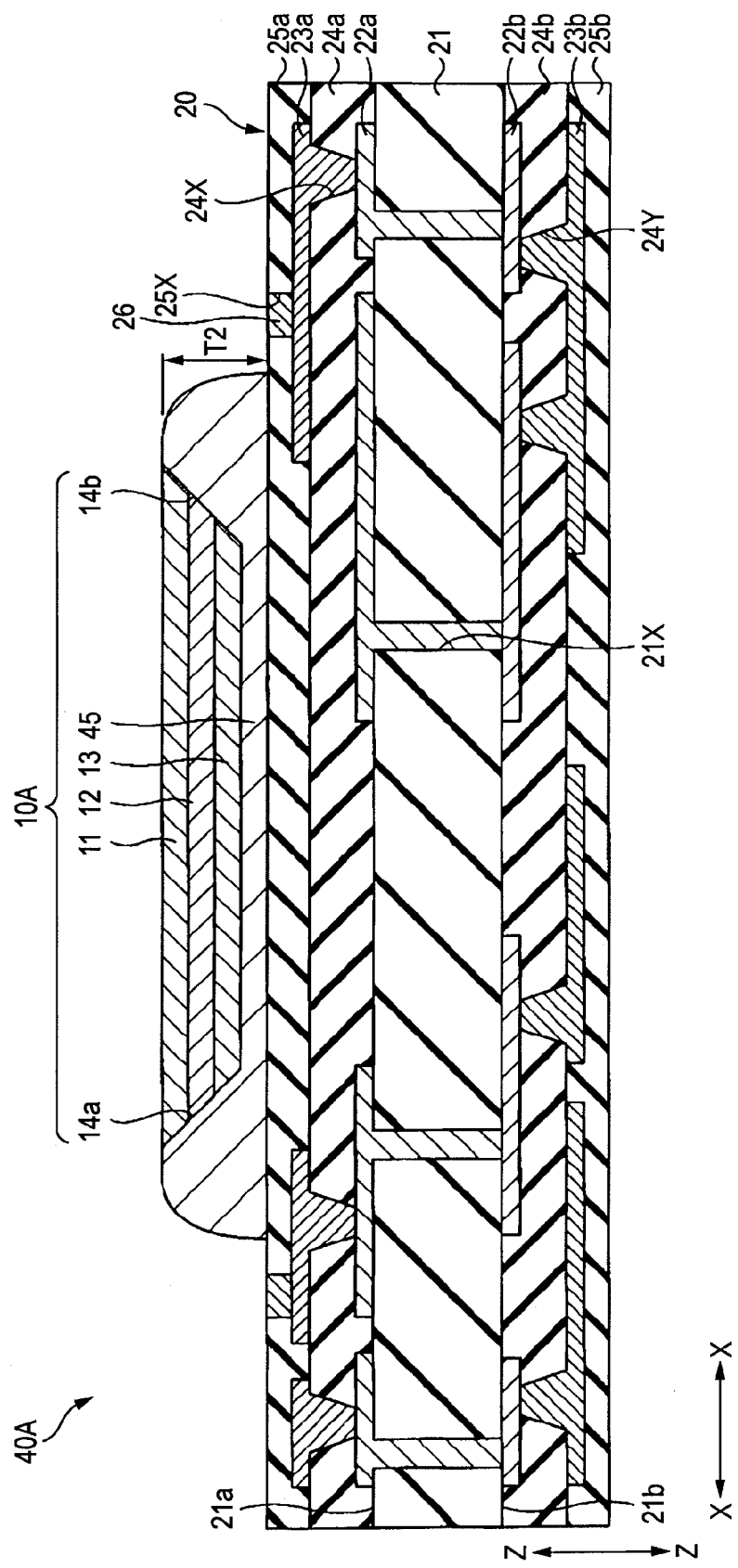
FIG. 13 is a cross-sectional view illustrating an optical waveguide mounting substrate in accordance with a third exemplary embodiment of the invention.

First, a description will be given of the structure of an optical waveguide mounting substrate 40A in accordance with a third exemplary embodiment of the invention. FIG. 13 is a cross-sectional view illustrating the optical waveguide mounting substrate 40A in accordance with the third exemplary embodiment. Referring to FIG. 13, the optical waveguide mounting substrate 40A in accordance with the third exemplary embodiment includes an optical waveguide 10A and a wiring substrate 20. The wiring substrate 20 is configured the same as in the first exemplary embodiment of the invention, and thus the description thereof will be omitted herein.

The optical waveguide 10A is configured the same as the optical waveguide 10 in accordance with the first exemplary embodiment, except that the outer cladding layer 15 is replaced by an outer cladding layer 45. The outer cladding layer 45 has dual functions as both the outer cladding layer 15 of the optical waveguide 10 and the bonding portion 30 of the optical waveguide mounting substrate 40. In other words, the outer cladding layer 45 not only has the same function as the outer cladding layer 15 of the optical waveguide 10 but also has the function of fixing the layered structure, which includes the first cladding layer 11, the core layer 12, and the second cladding layer 13, onto the first solder resist layer 25a of the wiring substrate 20.

The outer cladding layer 45 is made of a material, the refractive index of which is lower than that of the core layer 12. It is advantageous that the heat resistance of the outer cladding layer 45 can be substantially the same as that of the first cladding layer 11, the core layer 12, and the second cladding layer 13. The outer cladding layer 45 can be implemented with, for example, tetrafluoroethylene-perfluoro-dioxol copolymer, which is an annular fluorine resin. The refractive index Nc of the outer cladding layer 45 can be, for example, 1.3. The thickness T2 of the outer cladding layer 45 can be, for example, in the range from about 50 µm to about 250 µm. The structure of the optical waveguide mounting substrate 40A in accordance with the third exemplary embodiment of the invention is described as above.

[Fabrication Method of Optical Waveguide Mounting Substrate]

Figure 14:
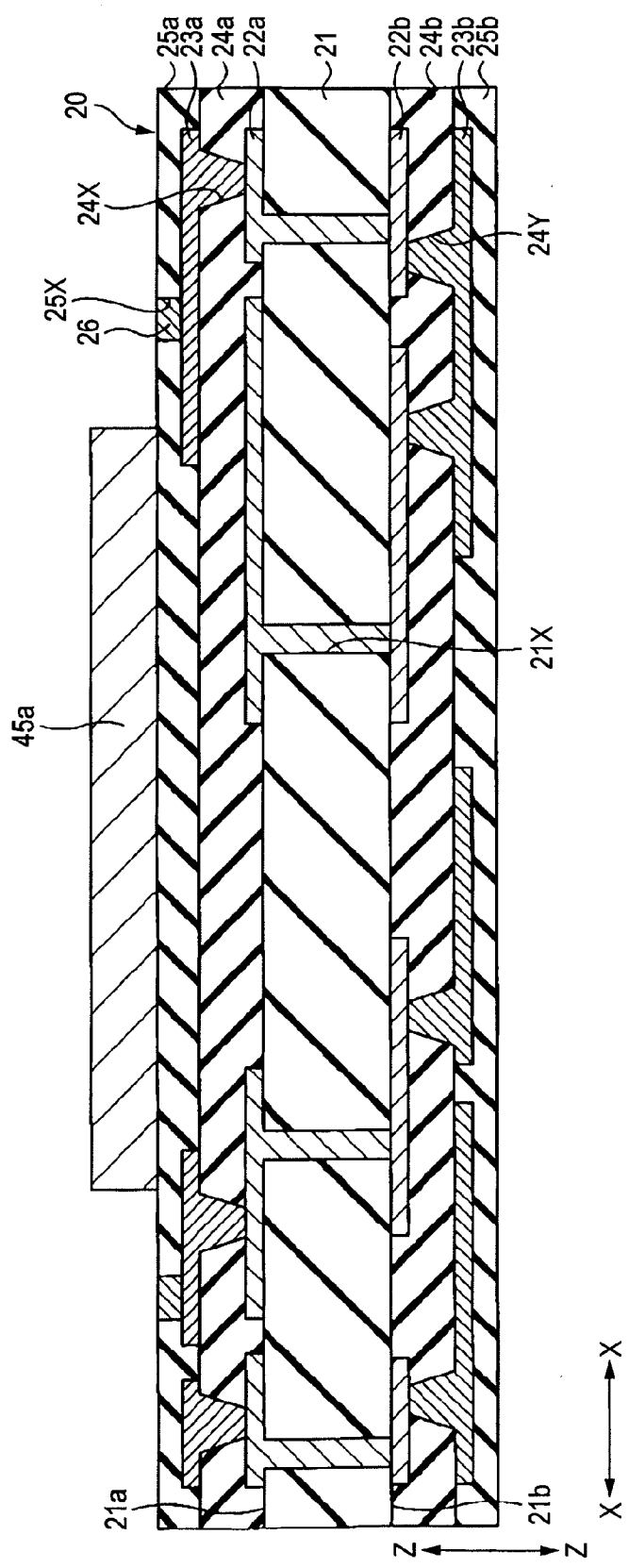
FIG. 14 is a schematic view illustrating a (first) fabrication process of the an optical waveguide mounting substrate in accordance with the third exemplary embodiment of the invention.
Figure 15:
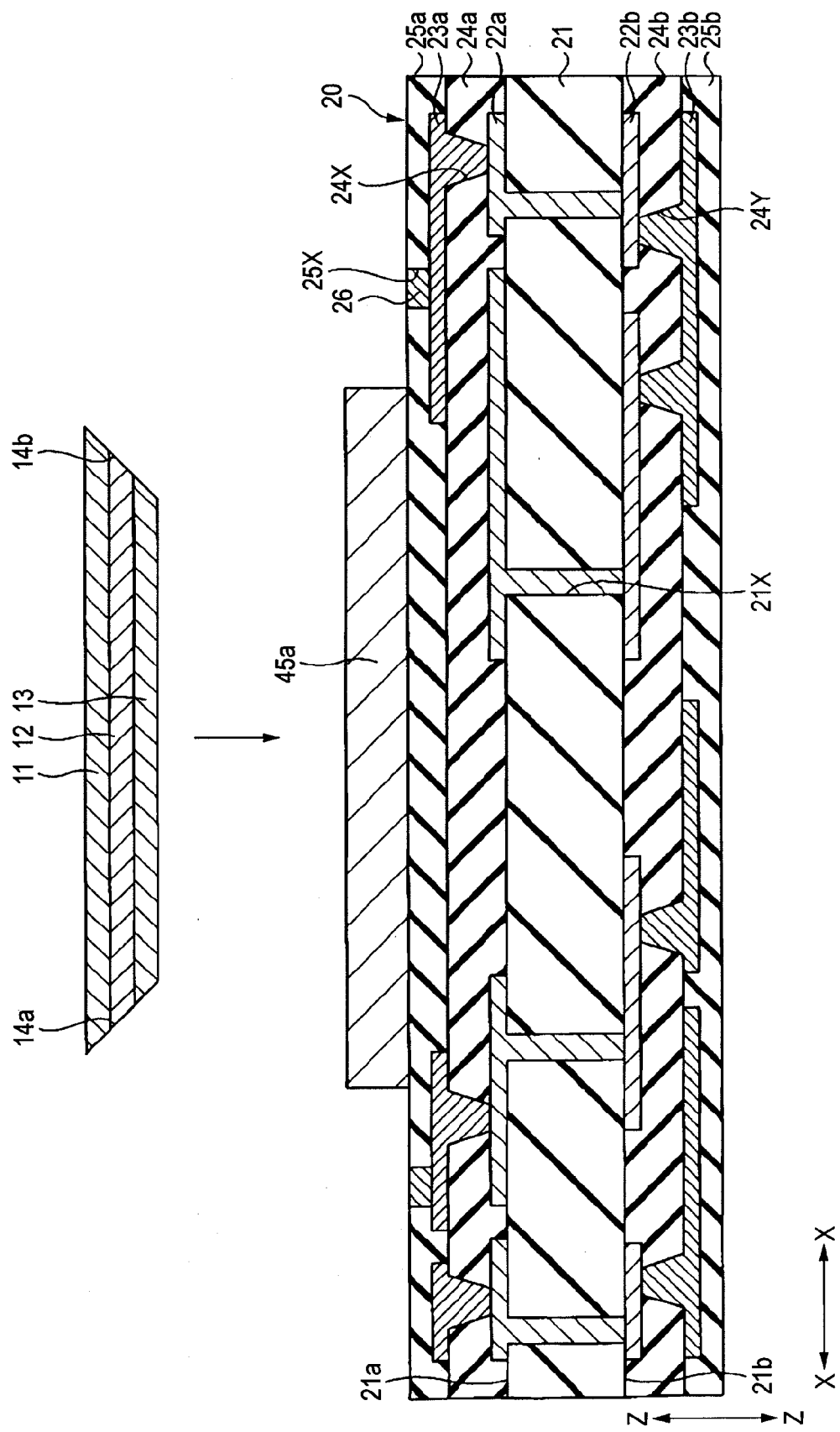
FIG. 15 is a schematic view illustrating a (second) fabrication process of the an optical waveguide mounting substrate in accordance with the third exemplary embodiment of the invention.

In sequence, a description will be given of a fabrication method of the optical waveguide mounting substrate 40A in accordance with the third exemplary embodiment. FIGS. 14 and 15 are views illustrating fabrication processes of the optical waveguide mounting substrate 40A in accordance with the third exemplary embodiment. In FIGS. 14 and 15, the same reference numerals will be given to the same components as in FIG. 13, and the description of the same components will be omitted when necessary.

First, in the process shown in FIG. 14, the wiring substrate 20 is prepared, and an outer cladding layer 45a is arranged on the first solder resist layer 25a of the wiring substrate 20. The wiring substrate 20 is the same as described above. The outer cladding layer 45a will finally form the outer cladding layer 45. The outer cladding layer 45a can be implemented with, for example, a film of tetrafluoroethylene-perfluoro-dioxol copolymer or the like, which is an annular fluorine resin.

Then, in the process shown in FIG. 15, the layered structure including the first cladding layer 11, the core layer 12, and the second cladding layer 13 as shown in FIG. 6 is arranged on the outer cladding layer 45a. Specifically, the layered structure including the first cladding layer 11, the core layer 12, and the second cladding layer 13 as shown in FIG. 6 is adsorbed by a stage arm of a precision stage. Then, the layered structure including the first cladding layer 11, the core layer 12, and the second cladding layer 13 is aligned and arranged on the outer cladding layer 45a by adjusting the position of the layered structure with respect to, for example, the solder land 26 of the wiring substrate 20 by moving the stage arm.

Next, the outer cladding layer 45a is heated, for example, at about 120° C., and the layered structure including the first cladding layer 11, the core layer 12, and the second cladding layer 13 is pressed starting from the first cladding layer 11. The outer cladding layer 45a is cured by heating. The cured outer cladding layer 45a forms the outer cladding layer 45. The outer cladding layer 45 seals the inclined surfaces 14a and 14b of the layered structure including the first cladding layer 11, the core layer 12, and the second cladding layer 13. As a result, the layered structure including the first cladding layer 11, the core layer 12, and the second cladding layer 13 together with the outer cladding layer 45 forms the optical waveguide 10A having the same function as the optical waveguide 10, thereby producing the optical waveguide mounting substrate 40A as shown in FIG. 13. The fabrication method of the optical waveguide mounting substrate 40A in accordance with the third exemplary embodiment of the invention is described as above.

[Function of Optical Waveguide Mounting Substrate]

The function of the optical waveguide mounting substrate 40A in accordance with the third exemplary embodiment is the same as that of the optical waveguide 10 in accordance with the first exemplary embodiment, and thus the description thereof will be omitted herein.

The optical waveguide mounting substrate 40A in accordance with the third exemplary embodiment can realize an optical waveguide mounting substrate on which the optical waveguide 10 in accordance with the first exemplary embodiment is mounted. Accordingly, the same effects as those of the optical waveguide 10 in accordance with the first exemplary embodiment are obtained.

In addition, the outer cladding layer 45 has dual functions as both the outer cladding layer 15 of the optical waveguide 10 and the bonding portion 30 of the optical waveguide mounting substrate 40. This, as a result, makes it possible to incorporate the process of forming the outer cladding layer 15 of the optical waveguide 10 and the process of forming the bonding portion 30 of the optical waveguide mounting substrate 40 into one process, thereby simplifying the entire fabrication process of the optical waveguide mounting substrate 40A.

Fourth Exemplary Embodiment

A fourth exemplary embodiment of the invention presents an example of a light transmitting and receiving device using the optical waveguide mounting substrate in accordance with the second exemplary embodiment of the invention.

[Structure of Light Transmitting and Receiving Device]

Figure 16:
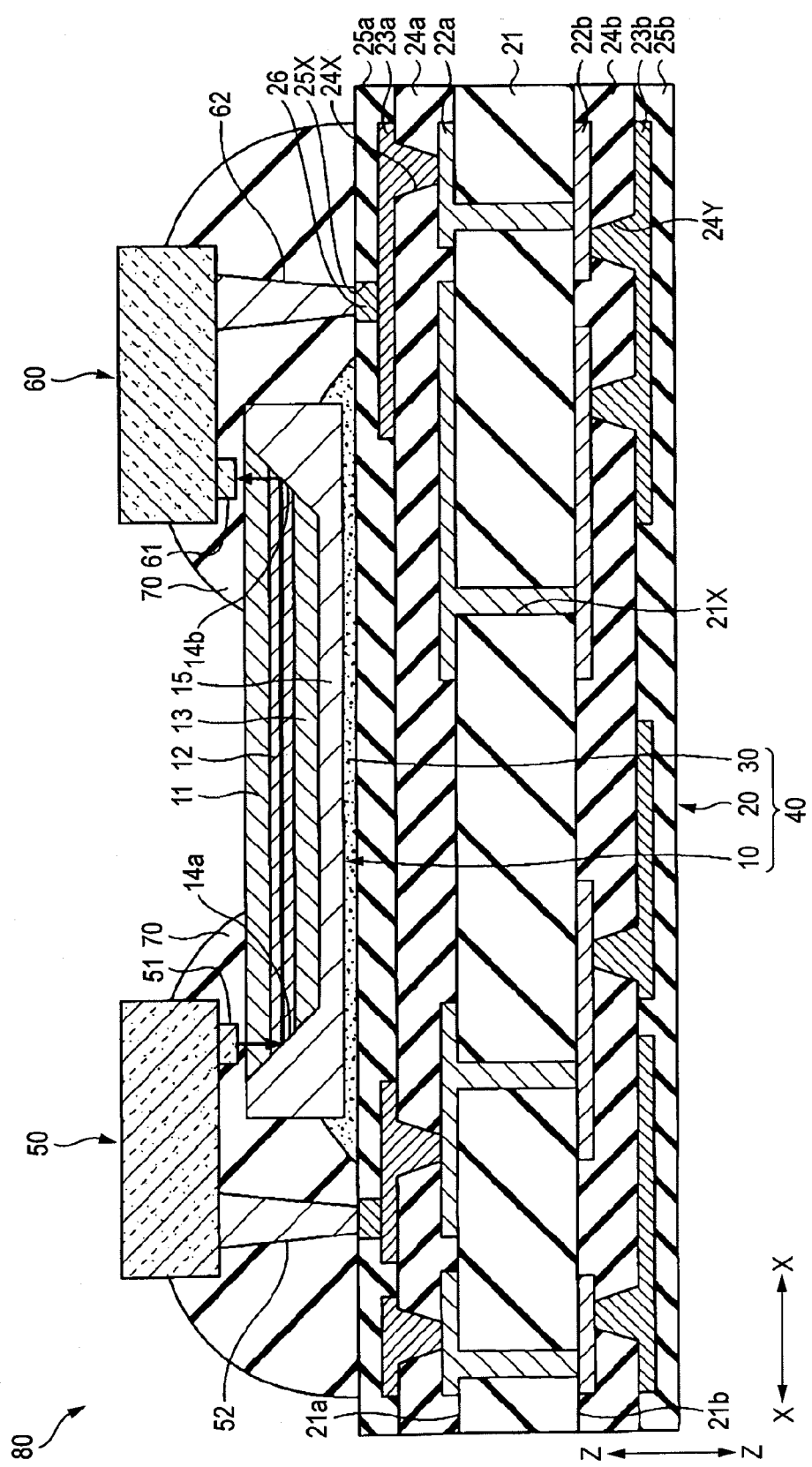
FIG. 16 is a cross-sectional view illustrating a light transmitting and receiving device in accordance with a fourth exemplary embodiment of the invention.

First, the structure of a light transmitting and receiving device 80 in accordance with the fourth exemplary embodiment of the invention will be described. FIG. 16 is a cross-sectional view illustrating the light transmitting and receiving device 80 in accordance with the fourth exemplary embodiment of the invention. Referring to FIG. 16, the light transmitting and receiving device 80 includes an optical waveguide mounting substrate 40 (including an optical waveguide 10, a wiring substrate 20, and a bonding portion 30), a light-emitting device 50, a bump 52, a light-receiving device 60, a bump 62, and an underfill resin 70. The optical waveguide mounting substrate 40 is the same as that of the second exemplary embodiment, and thus the description thereof will be omitted herein.

The light-emitting device 50 has a light-emitting portion 51. The light-emitting portion 51 is arranged in a position where light can be emitted to the inclined surface 14a of the optical waveguide 10. The light-emitting device 50 can be, for example, a Vertical Cavity Surface Emitting Laser (VCSEL) or the like. The light-emitting device 50 can also be implemented with a Light Emitting Diode (LED) or the like. The bump 52 electrically connects the light-emitting device 50 with the solder land 26 of the wiring substrate 20. The bump 52 can be implemented with, for example, an Au bump.

The light-receiving device 60 has a light-receiving portion 61. The light-receiving portion 61 is arranged in a position where light output from the inclined surface 14b of the optical waveguide 10 can enter. The light-receiving device 60 can be implemented with, for example, a photodiode or a phototransistor. The bump 62 electrically connects the light-receiving device 60 with the solder land 26 of the wiring substrate 20. The bump 62 can be implemented with, for example, an Au bump.

The underfill resin 70 is injected between the light-emitting device 50 and the first solder resist layer 25a of the wiring substrate 20 or the like and between the light-receiving device 60 and the first solder resist layer 25a of the wiring substrate 20 or the like, thereby fixing the light-emitting device 50 and the light-receiving device 60 on the mounting substrate 40. The underfill resin 70 can be implemented with any material, which allows a wavelength emitted from the light-emitting device 50 to pass through. For example, the underfill resin 70 can be made of an optical path coupling adhesive, which is a UV curable or thermosetting type. The structure of the light transmitting and receiving device 80 in accordance with the fourth exemplary embodiment is described as above.

[Fabrication Method of Light Transmitting and Receiving Device]

Description of the light transmitting and receiving device 80 in accordance with the fourth exemplary embodiment of the invention will be omitted herein.

[Function of Light Transmitting and Receiving Device]

To continue, a description will be given of the function of the light transmitting and receiving device 80 in accordance with the fourth exemplary embodiment. In the light transmitting and receiving device 80, as indicated by an arrow in FIG. 16, a ray of light emitted from the light-emitting portion 51 of the light-emitting device 50 enters the optical waveguide 10 and travels through the first cladding layer 11 and the core layer 12 before reaching the inclined surface 14a. Since the refractive index of the core layer 12 is set higher than that of the outer cladding layer 15 as described above, the light incident onto the core layer 12 is totally or partially reflected by inclined surface 14a to change its transmission direction, for example, by about 90°.

As described above, since the refractive index of the core layer 12 is set higher than that of the first cladding layer 11 and the second cladding layer 13, after the light has entered the core layer 12 by changing its transmission direction, for example, by about 90°, it is transmitted through the inside of the core layer 12 without passing through the first cladding layer 11 or the second cladding layer 13.

After the light has been transmitted through the inside of the core layer 12, it reaches the inclined surface 14b. As described above, since the refractive index of the core layer 12 is set higher than that of the outer cladding layer 15, the light, which reached the inclined surface 14b, is totally or partially reflected by the inclined surface 14b, thereby changing its transmission direction, for example, by about 90°. The light, whose transmission direction is changed, for example, by about 90°, enters the light-receiving portion 61 of the light-receiving device 60 by passing through the first cladding layer 11. As such, the inclined surfaces 14a and 14b have the function of changing the transmission direction of the light so that the light emitted from the light-emitting portion 51 of the light-emitting device 50 is transmitted to the light-receiving portion 61 of the light-receiving device 60.

The light transmitting and receiving device 80 in accordance with the fourth exemplary embodiment can realize a light transmitting and receiving device on which the optical waveguide 10 in accordance with the first exemplary embodiment is mounted. Accordingly, the same effects as those of the optical waveguide 10 in accordance with the first exemplary embodiment are obtained.

Fifth Exemplary Embodiment

A fifth exemplary embodiment of the invention presents another example of a light transmitting and receiving device using the optical waveguide mounting substrate in accordance with the second exemplary embodiment of the invention.

[Structure of Light Transmitting and Receiving Device]

Figure 17:
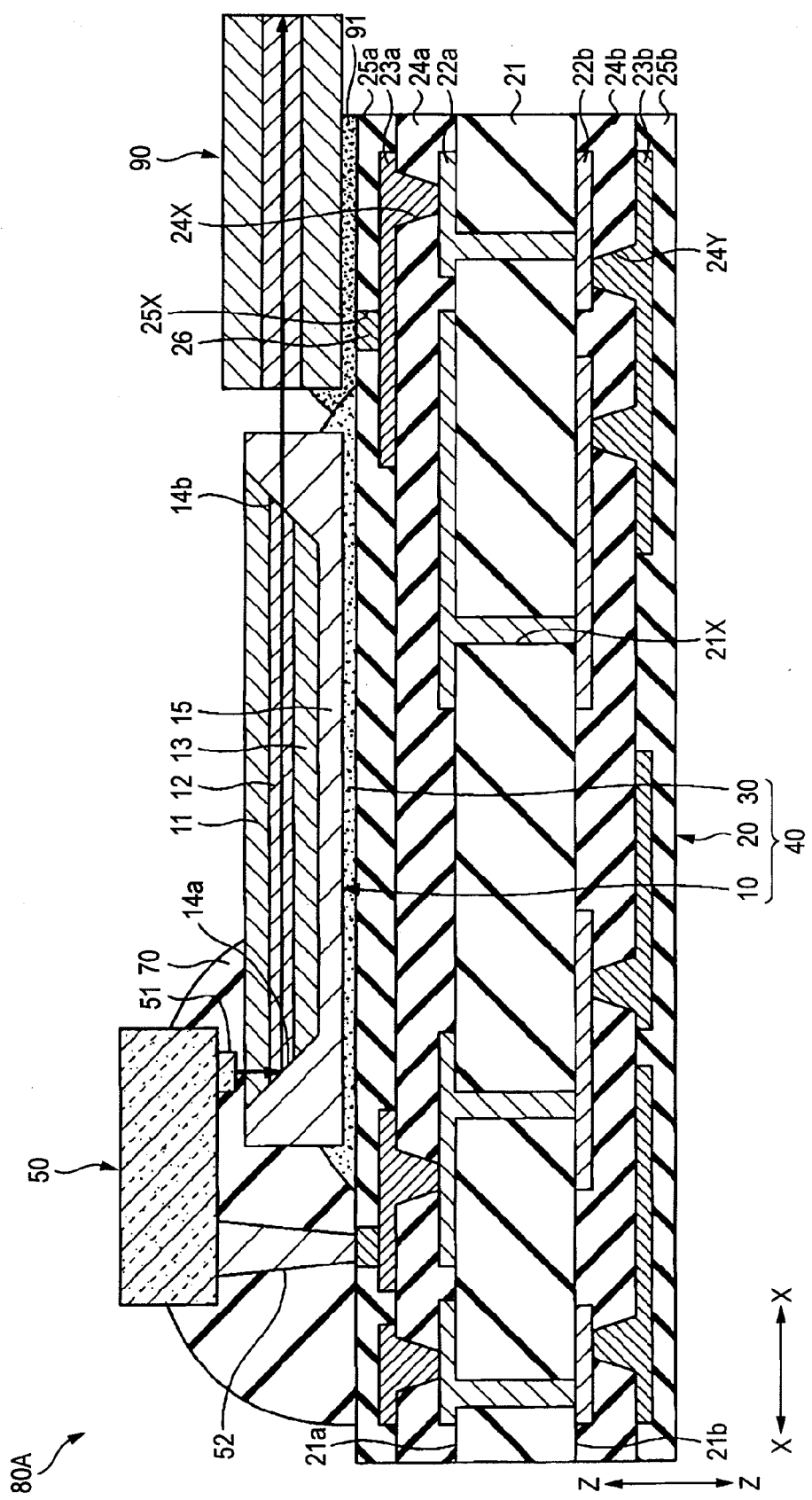
FIG. 17 is a cross-sectional view illustrating a light transmitting and receiving device in accordance with a fifth exemplary embodiment of the invention.

First, the structure of a light transmitting and receiving device 80A in accordance with the fifth exemplary embodiment will be now described. FIG. 17 is a cross-sectional view illustrating the light transmitting and receiving device 80A in accordance with the fifth exemplary embodiment of the invention. Referring to FIG. 17, the light transmitting and receiving device 80A in accordance with the fifth exemplary embodiment includes an optical waveguide mounting substrate 40 (including an optical waveguide 10, a wiring substrate 20, and a bonding portion 30), a light-emitting device 50, a bump 52, an underfill resin 70, an optical fiber 90, and a bonding portion 91. The optical waveguide mounting substrate 40 will not be described further since it is configured the same as that of the second exemplary embodiment. Below, the light transmitting and receiving device 80A in accordance with the fifth exemplary embodiment will be described only with respect to parts differing from those of the light transmitting and receiving device 80 in accordance with the fourth exemplary embodiment of the invention.

The optical fiber 90 is fixed over the first solder resist layer 25a of the wiring substrate 20 by the bonding portion 91, particularly, in a position where light from the optical waveguide 10 can enter. The optical fiber 90 is a typical optical fiber known in the art. The material of the bonding portion 91 can be implemented with, for example, a thermosetting epoxy-based adhesive or a UV curable epoxy-based adhesive. The structure of the light transmitting and receiving device 80A in accordance with the fifth exemplary embodiment is described as above.

[Fabrication Method of Light Transmitting and Receiving Device]

Description of the light transmitting and receiving device 80A in accordance with the fifth exemplary embodiment will be omitted herein.

[Function of Light Transmitting and Receiving Device]

Next, a description will be given of the function of the light transmitting and receiving device in accordance with the fifth exemplary embodiment of the invention. In the light transmitting and receiving device 80A, as indicated by an arrow in FIG. 17, a ray of light emitted from the light-emitting portion 51 of the light-emitting device 50 enters the optical waveguide 10 and travels through the first cladding layer 11 and the core layer 12 before reaching the inclined surface 14a. Since the refractive index of the core layer 12 is set higher than that of the outer cladding layer 15 as described above, the light incident onto the core layer 12 is totally or partially reflected by inclined surface 14a to change its transmission direction, for example, by about 90°.

As described above, since the refractive index of the core layer 12 is set higher than that of the first cladding layer 11 and the second cladding layer 13, after the light has entered the core layer 12 by changing its transmission direction, for example, by about 90°, it is transmitted through the inside of the core layer 12 without passing through the first cladding layer 11 or the second cladding layer 13.

After having been transmitted through the inside of the core layer 12, the light is output from one end of the optical waveguide 10 facing the optical fiber 90. The light output from the optical waveguide 10 enters the optical fiber 90. The light, which has entered the optical fiber 90, can be transmitted to a given position.

The light transmitting and receiving device 80A in accordance with the fifth exemplary embodiment can realize a light transmitting and receiving device on which the optical waveguide 10 in accordance with the first exemplary embodiment is mounted. Accordingly, the same effects as those of the optical waveguide 10 in accordance with the first exemplary embodiment are obtained.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

For example, while the light transmitting and receiving devices of the fourth and fifth exemplary embodiments have been illustrated using the optical waveguide mounting substrate in accordance with the second exemplary embodiment, the optical waveguide mounting substrate in accordance with the third exemplary embodiment can also be properly used instead of this.

In addition, the light transmitting and receiving device of the fourth exemplary embodiment has been illustrated which includes the light-emitting device and the light-receiving device, and the light transmitting and receiving device of the fifth exemplary embodiment has been illustrated which includes the light-emitting device without the light-receiving device. However, a light transmitting and receiving device having a light-receiving device without a light-emitting device can also be realized. This can be realized using an optical waveguide having one surface, which changes the transmission direction of light, which enters from outside, towards the light-receiving device.

In addition, the optical waveguide can be directly formed on the wiring substrate, on which an electrical circuit is formed, instead of the support substrate. In this case, in the process shown in FIG. 2, the wiring substrate, on which an electrical circuit is formed, is prepared instead of the support substrate.

Moreover, the wiring substrate can be implemented with various forms of wiring substrates rather than being limited to one particular aspect as illustrated in the second exemplary embodiment. For example, the wiring substrates may include, but not limited to, a one-sided (one-layer) wiring substrate, in which a wiring layer is formed only on one side of the substrate; a double-sided (two-layer) wiring substrate, in which wiring layers are formed on both sides of the substrate; a through-type multilayer wiring substrate, in which respective wiring layers are connected by through-vias; and an Interstitial Via Hole (IVH) multilayer wiring substrate, in which a specific wiring layer is connected by an IVH or the like.

What is claimed is:

1. An optical waveguide comprising:
    a layered structure comprising:
        a first cladding layer;
        a second cladding layer; and
        a core layer that is sandwiched between the first cladding layer and the second cladding layer, wherein an inclined surface is formed on at least one longitudinal end of the layered structure; and
    a solid outer cladding layer that seals and directly contacts a portion of the inclined surface corresponding to the core layer,
    wherein a refractive index of the outer cladding layer is smaller than that of the core layer, and
    wherein a metal film is not formed on the inclined surface.

2. The optical waveguide according to claim 1, wherein light incident into the optical waveguide is totally or partially reflected by the inclined surface.

3. The optical waveguide according to claim 1,
    wherein an angle between an outer surface of the first cladding layer and the inclined surface is an acute angle, and
    wherein the outer cladding layer also seals at least a portion of the inclined surface corresponding to the first cladding layer.

4. The optical waveguide according claim 1, wherein the outer cladding layer is made of a material containing an annular fluorine resin.

5. The optical waveguide according to claim 4, wherein the annular fluorine resin is tetrafluoroethylene-perfluoro-dioxol copolymer.

6. The optical waveguide according to claim 1, wherein light incident into the optical waveguide is totally reflected by the inclined surface.

7. The optical waveguide according to claim 1, wherein the inclined surface is formed on both longitudinal ends of the layered structure.

8. The optical waveguide according to claim 3, wherein the acute angle is about 45°.

9. An optical waveguide mounting substrate comprising:
    the optical waveguide according to claim 1; and
    a wiring substrate which mounts the optical waveguide thereon.

10. The optical waveguide mounting substrate according to claim 9, wherein the outer cladding layer has a function of a fixing agent for fixing the optical waveguide onto the wiring substrate.

11. A light transmitting and receiving device, comprising:
    the optical waveguide mounting substrate according to claim 9; and
    a light-emitting device that emits light to the optical waveguide.

12. The light transmitting and receiving device according to claim 11, further comprising: a light-receiving device that receives light output from the optical waveguide.

13. The optical waveguide according to claim 1, wherein the inclined surface of the layered structure extends continuously from the first cladding layer to the second cladding layer through the core layer in a thickness direction of the layered structure.

14. The optical waveguide according to claim 1, wherein the outer cladding layer entirely seals the inclined surface of the layered structure.

15. The optical waveguide according to claim 1, wherein the outer cladding layer airtightly seals the inclined surface of the layered structure.

* * * * *